(12) United States Patent
Du et al.

(10) Patent No.: US 10,505,531 B2
(45) Date of Patent: Dec. 10, 2019

(54) COMPENSATION DEVICE FOR A GATE DRIVING CIRCUIT AND METHOD THEREOF, GATE DRIVING CIRCUIT AND DISPLAY DEVICE

(71) Applicants: Beijing BOE Optoelectronics Technology Co., Ltd., Beijing (CN); BOE TECHNOLOGY GROUP CO., LTD., Beijing (CN)

(72) Inventors: Runfei Du, Beijing (CN); Xingjun Shu, Beijing (CN)

(73) Assignees: Beijing BOE Optoelectronics Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/102,712

(22) Filed: Aug. 13, 2018

(65) Prior Publication Data

US 2019/0207600 A1 Jul. 4, 2019

(30) Foreign Application Priority Data

Jan. 3, 2018 (CN) .......................... 2018 1 0003731

(51) Int. Cl.
    *G09G 3/30* (2006.01)
    *G09G 3/36* (2006.01)
    *H03K 17/14* (2006.01)
    *G11C 19/28* (2006.01)

(52) U.S. Cl.
    CPC ......... *H03K 17/145* (2013.01); *G09G 3/3677* (2013.01); *G11C 19/28* (2013.01); *G09G 2310/0286* (2013.01)

(58) Field of Classification Search
    CPC ..... G09G 3/3266; G09G 3/3674–3681; G09G 2310/02–0216; G09G 2310/0262–0297; G09G 2300/043
    See application file for complete search history.

(56) References Cited

U.S. PATENT DOCUMENTS

| 2009/0021498 A1* | 1/2009 | Wang | G09G 3/3648 345/204 |
| 2014/0292745 A1* | 10/2014 | Kikuchi | G09G 3/32 345/213 |
| 2014/0376682 A1* | 12/2014 | Jang | G11C 19/28 377/64 |
| 2017/0235406 A1* | 8/2017 | Su | G06F 3/0412 345/173 |

* cited by examiner

*Primary Examiner* — Sanghyuk Park
(74) *Attorney, Agent, or Firm* — Foley & Lardner LLP

(57) ABSTRACT

The present disclosure relates to the technical field of display, which provides a compensation device for a gate driving circuit and a method thereof, a gate driving circuit and a display device. The compensation device for a gate driving circuit, which the gate driving circuit includes a first shift register and a second shift register. The second shift register is configured to output a second scanning signal according to a first scanning signal output from the first shift register. Wherein, the compensation device for a gate driving circuit includes: a signal receiving unit, which is configured to receive the first scanning signal output from the first shift register; a signal compensation unit, which is configured to compare the first scanning signal with a reference voltage, and a compensation signal is output to the second shift register according to the comparison result to compensate the received first scanning signal.

13 Claims, 5 Drawing Sheets

COMPENSATION DEVICE FOR A GATE DRIVING CIRCUIT AND METHOD THEREOF, GATE DRIVING CIRCUIT AND DISPLAY DEVICE

CROSS REFERENCE

This application is based upon and claims priority to Chinese Patent Application No. 201810003731.X, filed on Jan. 3, 2018, the entire contents thereof are incorporated herein by reference.

TECHNICAL FIELD

The present disclosure relates to the technical field of display, and in particular, to a compensation device for a gate driving circuit and a method thereof, a gate driving circuit including the compensation device and a display device including the gate driving circuit.

BACKGROUND

In recent years, the trend of display is developing towards high integration and low cost. One of the most important technologies is that the line driving technology of array substrate achieves mass production. The gate switch circuit can be integrated on the array substrate of the display panel by using the line driving technology of array substrate, so the gate driving integrated circuit part can be omitted, to increase production capacity and reduce costs, and improve the integration of the display panel to make it more suitable for making narrow border or frameless display products.

It is to be noted that the information disclosed in the above background technology part is used only to strengthen the understanding of the background of the present disclosure, and thus may include information that does not constitute the existing technology known by ordinary technicians in the field.

SUMMARY

According to some arrangements of the present disclosure, a compensation device for a gate driving circuit is provided. The gate driving circuit includes a first shift register and a second shift register. The second shift register is configured to output a second scanning signal according to a first scanning signal output from the first shift register.

The compensation device for a gate driving circuit includes a signal receiving unit, configured to receive the first scanning signal output from the first shift register, a signal compensation unit, configured to compare the first scanning signal with a reference voltage, and a compensation signal is output to the second shift register according to the comparison result to compensate the first scanning signal received by the second shift register.

In some exemplary arrangements of the present disclosure, the signal receiving unit is a capacitor or voltage follower.

In some exemplary arrangements of the present disclosure, the signal compensation unit is an amplifier.

According to some arrangements of the present disclosure, a gate driving circuit is provided. The gate driving circuit includes a plurality of cascaded shift registers, an output end of the next level shift register is electrically connected to an input end of the current level shift register, the plurality of cascaded shift registers comprising a first shift register and a second shift register adjacent to each other, the first shift register is configured to output a first scanning signal according to a first input signal, the second shift register is configured to output a second scanning signal according to a second input signal, and the first scanning signal is the second input signal of the second shift register, a compensation device, electrically connected with a output end of the first shift register and an input end of the second shift register. The compensation device is configured to receive the first scanning signal, and compare the first scanning signal with a reference voltage. A compensation signal is output to the second shift register according to the comparison result to compensate the first scanning signal received by the second shift register.

In some exemplary arrangements of the present disclosure, the compensation device includes a signal receiving unit, configured to receive the first scanning signal outputs by the first shift register, a signal compensation unit, configured to compare the first scanning signal with the reference voltage, and the compensation signal is output to the second shift register according to the comparison result to compensate the first scanning signal received by the second shift register.

In some exemplary arrangements of the present disclosure, responsive to determining that the first scanning signal is less than the reference voltage, the output end of the signal compensation unit outputs the compensation signal.

In some exemplary arrangements of the present disclosure, the signal receiving unit is a capacitor or a voltage follower.

According to some arrangements of the present disclosure, a gate driving circuit compensation method is provided, which is applied to the above-mentioned gate driving circuit. The method includes the compensation device receiving the first scanning signal of the first shift register, and compares the first scanning signal with a reference voltage, responsive to determining that the first scanning signal is less than the reference voltage, the compensation device outputs a compensation signal to the second shift register to compensate for a signal amplitude of the first scanning signal.

In some exemplary arrangements of the present disclosure, the compensation device includes a signal receiving unit, configured to receive the first scanning signal outputs by the first shift register, a signal compensation unit, configured to compare the first scanning signal with the reference voltage, and the compensation signal is output to the second shift register according to the comparison result to compensate the first scanning signal received by the second shift register.

According to some arrangements of the present disclosure, a display device is provided. The display device includes the above-mentioned gate driving circuit.

The present disclosure should be understand that the above general description and the detailed description of the post text are only illustrative and explanatory, and do not limit the present disclosure.

BRIEF DESCRIPTION OF THE DRAWINGS

Accompanying drawings here are incorporated into the specification and constitute part of the specification, which shown some arrangements in conformity with the present disclosure, and are used together with the specification to explain the principle of the present disclosure. It should be obvious that accompanying drawings in the following description are merely some arrangements of the present disclosure. Other drawings may also be obtained according to these accompanying drawings for those ordinary skilled in the art, without any creative work.

DETAILED DESCRIPTION

Figure 1:
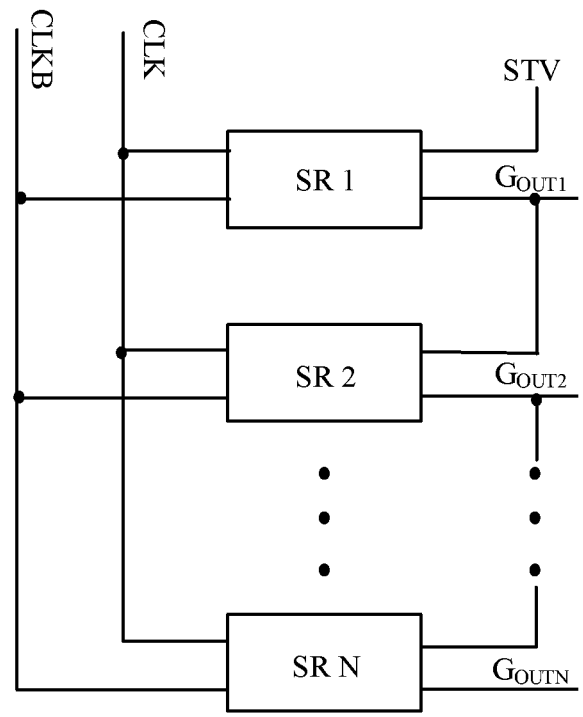
FIG. 1 is a schematic structural diagram of a gate driving circuit in related technology.

Now the exemplary arrangements of the present disclosure will be further described in detail with reference to the accompanying drawings. However, the exemplary arrangements can be implemented in a variety of forms and should not be understood as limited to the examples described here; on the contrary, providing these arrangements will make the present disclosure more comprehensive and complete, and convey the idea of the exemplary arrangements to the technicians in the field fully. The features, structures, or characteristics described can be combined in one or more arrangements in any suitable way. In the following description, many specific details are provided to give a full understanding of the arrangements of the present disclosure. However, the skilled in the art will be aware that can practice the technical scheme of the present disclosure omitting one or more of the specified details, or can use other methods, components, devices, blocks, etc. in other cases, it does not elaborate or describe the well-known technical solutions to avoid the confusion of the various arrangements of the present disclosure.

The use of the terms "one", "a", "the" and "described" in the specification is used to indicate the existence of one or more elements/components/etc.; the terms "include" and "have" are used to express the meaning of open and comprising, and there are other elements/components/etc. besides the elements/components/etc. listed above; the terms "first: and "second" etc. are used only as markers, not a limit to quantity of their objects.

In addition, the accompanying drawings are only schematic diagrams of the present disclosure, not necessarily plotted in proportion. The same map marks in the drawings represent the same or similar parts, so they will be omitted to repeat them. Some of the block diagrams shown in the drawings are functional entities, which do not necessarily correspond to physical or logically independent entities.

In related technology, the gate driving circuit is usually achieved by a plurality of cascaded shift registers, and the output of the next level shift register is triggered by the output signal of the current level shift register. However, with the increasing number of the cascading shift registers, the output signal will attenuate during transmission, which will affect the display effect.

In view of this, how to reduce attenuation and improve the display effect of display panel is urgently needed in this field.

FIG. 1 shows a gate driving circuit in the related art, which includes a plurality of shift register unit SR 1, SR 2 . . . SR N, and the N (N is a positive integer greater than or equal to 1) shift registers are cascaded in order. The output of the next level shift register is triggered by the output signal of the current level shift register. However, with the increasing number of the cascading shift registers, the output signal will attenuate during transmission, which will affect the display effect.

In order to solve the technical problems existing in the related art, a compensation device for a gate driving circuit is provided firstly in the exemplary arrangement. The gate driving circuit includes a first shift register and a second shift register. An output end of the first shift register outputs a first scanning signal to an input end of the second shift register. The second shift register is configured to output a second scanning signal according to a first scanning signal output from the first shift register.

Figure 2:
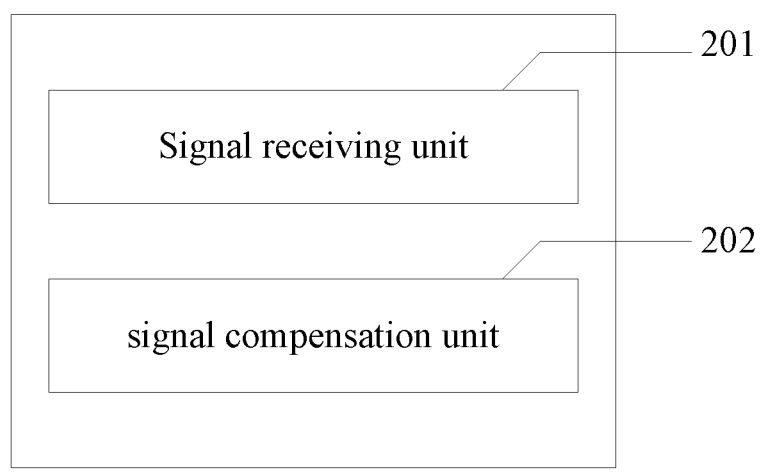
FIG. 2 is a schematic structural diagram of a compensation device for a gate driving circuit according to an exemplary arrangement of the present disclosure.

FIG. 2 shows a structure of a compensation device for a gate driving circuit, the compensation device for a gate driving circuit includes a signal receiving unit 201 and a signal compensation unit 202. The signal receiving unit 201 is configured to receive the first scanning signal output from the output end of the first shift register. The signal compensation unit 202 is configured to compare the first scanning signal with a reference voltage. A compensation signal is output to the second shift register according to the comparison result to compensate the first scanning signal, and is input to the second shift register through the input end of the second shift register, so as to ensure the display quality of the display panel.

The compensation device for a gate driving circuit in the present disclosure includes a signal receiving unit and a signal compensation unit, by comparing the scanning signal with a reference voltage and compensating the gate driving circuit according to the comparison result. The compensation device for a gate driving circuit in the present disclosure, on the one hand, can determine the degree of signal attenuation according to the comparison result of the scanning signal output from the front level shift register and the reference voltage, and can compensate the signal in time by the signal compensation unit, which improves the display effect of the display panel, ensures and improves the picture quality and customer experience; on the other hand, the compensation device for a gate driving circuit has the advantages of simple structure, simple operation, reduced manufacturing cost and improved detection efficiency.

Figure 3:
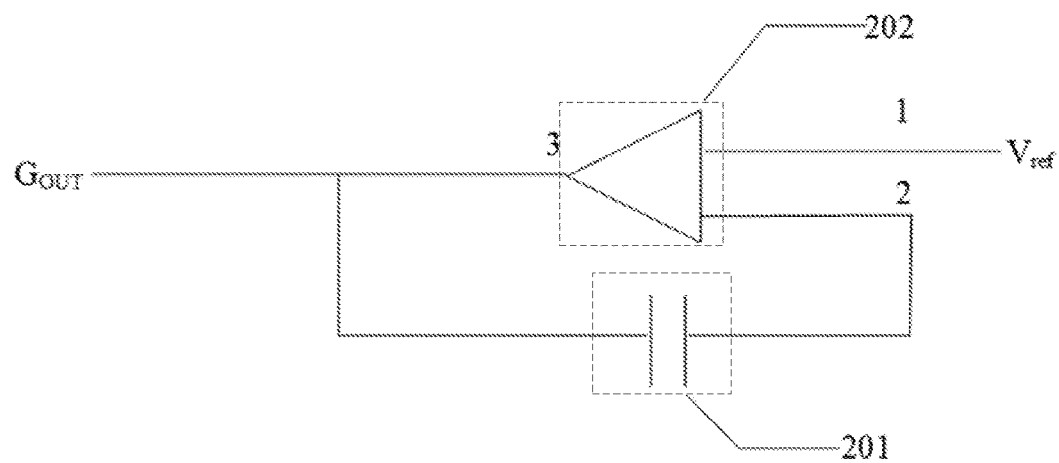
FIG. 3 is a schematic structural diagram of a compensation device for a gate driving circuit according to an exemplary arrangement of the present disclosure.

Further, the schematic diagram of the compensation device for a gate driving circuit is shown in FIG. 3. The signal receiving unit 201 receives a scanning signal $G_{OUT}$ output from a shift register, and feeds back the scanning signal $G_{OUT}$ to a second input port 2 of the signal compensation unit 202. A first input port 1 of the signal compensation unit 202 connects to a reference voltage source. The reference voltage source outputs a reference voltage $V_{ref}$. The signal compensation unit 202 compares the scanning signal $G_{OUT}$ with the reference voltage $V_{ref}$, and outputs a compensation signal from the output end 3 to adjacent another shift register according to the comparison result to compensate for the scanning signal $G_{OUT}$ received by the adjacent another shift register.

The signal receiving unit 201 may be a capacitor, or may be a voltage follower or other components, as long as it receives the scanning signal which outputs from the shift register and feeds back the scanning signal to the second input port 2 of the signal compensation unit 202 in order to compare with the reference voltage. The detailed description is omitted herewith. From the perspective of circuit volume and device integration, using the capacitor as the signal receiving unit in one or multiple arrangements.

The signal compensation unit 202 may be an amplifier which are commonly used in the field, for example, an operational amplifier, as long as it can realize the function of comparison and magnification. The detailed description is also omitted herewith. The signal compensation unit 202 compares the scanning signal with the reference voltage, and responsive to determining that the scanning signal is less than the reference voltage, the output end of the signal compensation unit 202 outputs a compensation signal to compensate the signal amplitude of the scanning signal.

Figure 4:
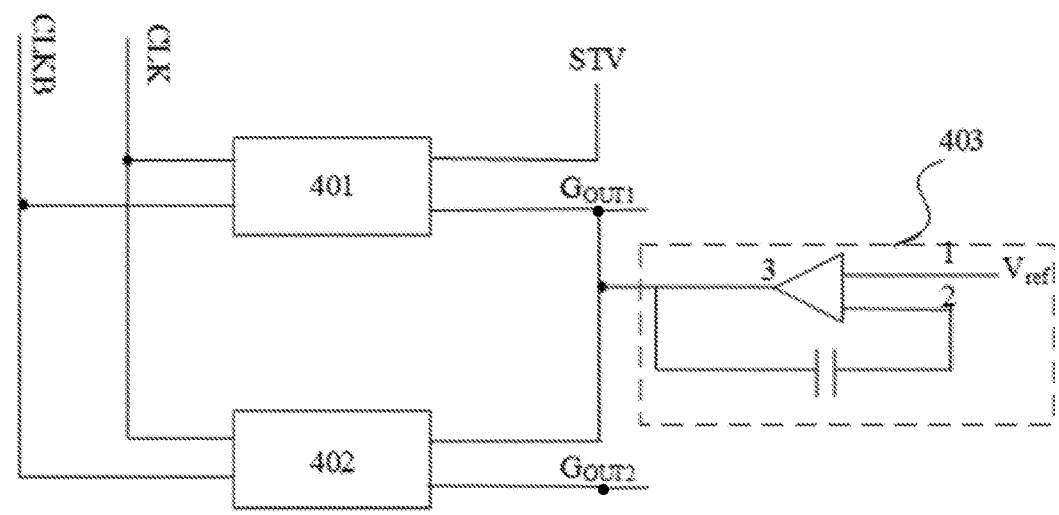
FIG. 4 is a schematic structural diagram of a gate driving circuit according to an exemplary arrangement of the present disclosure.

FIG. 4 shows the structure of a gate driving circuit. The gate driving circuit includes: a first shift register 401; a second shift register 402; and a compensation device 403. The first shift register 401 is configured to output a first scanning signal $G_{OUT1}$ according to an input signal STV. The second shift register 402 is configured to output a second scanning signal $G_{OUT2}$ according to an input signal, and the input signal of the second shift register 402 is the first scanning signal $G_{OUT1}$. The compensation device 403 is electrically connected with an output end of the first shift register 401. The compensation device 403 is configured to receive the first scanning signal $G_{OUT1}$, and compare the first scanning signal $G_{OUT1}$ with a reference voltage $V_{ref}$. A compensation signal is output to the second shift register 402 according to the comparison result to compensate the received first scanning signal $G_{OUT1}$. In the arrangement shown in FIG. 4, the first scanning signal $G_{OUT1}$ and the second scanning signal $G_{OUT2}$ may also be output to a gate of the corresponding pixel unit of a display panel, which is used to drive the display panel.

The gate driving circuit in the present disclosure can detect the attenuation of the scanning signals which is output from the shift registers at each level in time through the external gate driving circuit compensation device 403. Responsive to determining that the scanning signal is attenuated to be less than the reference voltage, the output end of the compensation device 403 outputs a compensation signal to compensate the signal amplitude of the scanning signal which is output from the shift register, and to improve the display effect of the display panel.

Further, as shown in FIG. 4, the first ends of the first shift register 401 and the second shift register 402 are all connected with a clock signal CLK, and the second ends of the first shift register 401 and the second shift register 402 are all connected with a reverse phase signal CLKB to the clock signal CLK. The first shift register 401 and the second shift register 402 are driven by the clock signal CLK and the reverse phase signal CLKB.

In some exemplary arrangements of the present disclosure, the compensation device 403 of the gate driving circuit includes a signal receiving unit and a signal compensation unit, whose concrete structure is shown in FIG. 2-3. The signal receiving unit receives the first scanning signal $G_{OUT1}$ output from the first shift register 401, and feeds back to the second input port 2 of the signal compensation unit 201. The signal compensation unit compares the first scanning signal $G_{OUT1}$ with a reference voltage, and the compensation signal is output to the second shift register 402 according to the comparison result to compensate the first scanning signal $G_{OUT1}$.

Further, the signal receiving unit may be a capacitor or voltage follower, the signal compensation unit may be an amplifier which are commonly used in the field, for example, an operational amplifier. Responsive to determining that the first scanning signal $G_{OUT1}$ is less than the reference voltage, the output end of the signal compensation unit outputs a compensation signal to compensate the first scanning signal $G_{OUT1}$.

Figure 5:
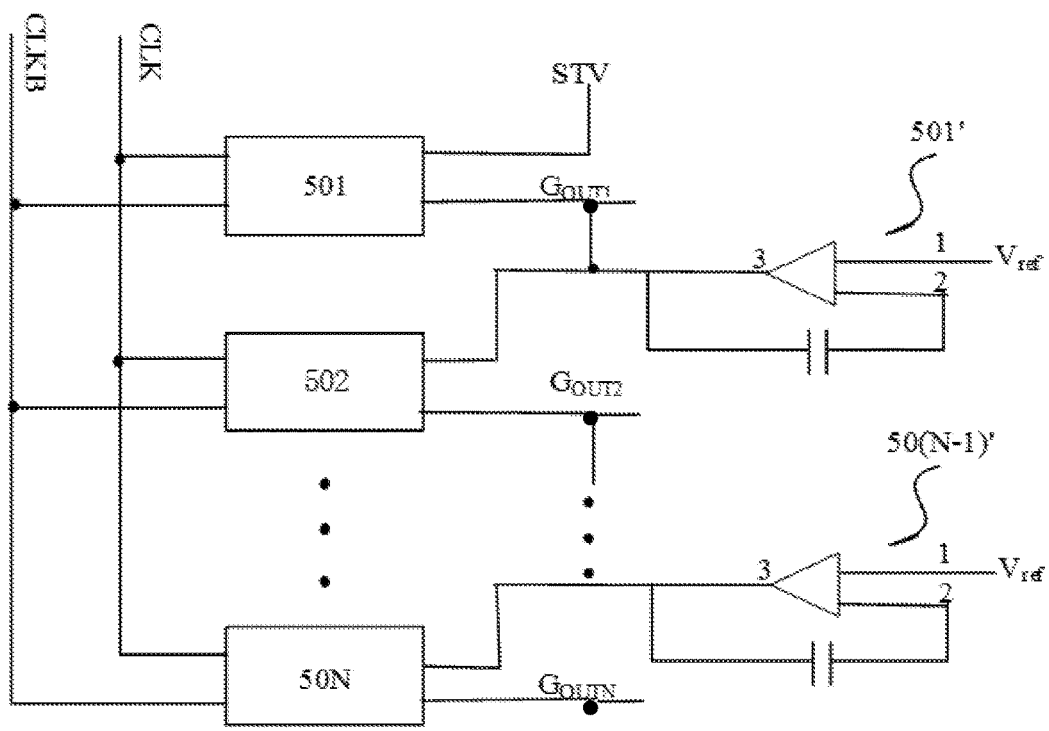
FIG. 5 is a schematic structural diagram of a gate driving circuit according to an exemplary arrangement of the present disclosure.

It should be understood by those skilled in the art that the circuit structure shown in FIG. 4 is intended to illustrate the operating principle of the gate driving circuit of the present disclosure, and not to limit the present disclosure to include two shift registers. The gate driving circuit in the present disclosure can set up a plurality of shift registers according to actual needs. As shown in FIG. 5, the gate driving circuit contains N (N>2) shift registers 501, 502, . . . , 50N and (N−1) compensation devices 501', 502', . . . , 50N'. The N shift registers are cascaded successively, and two adjacent shift registers are connected with the compensation devices.

Figure 6:
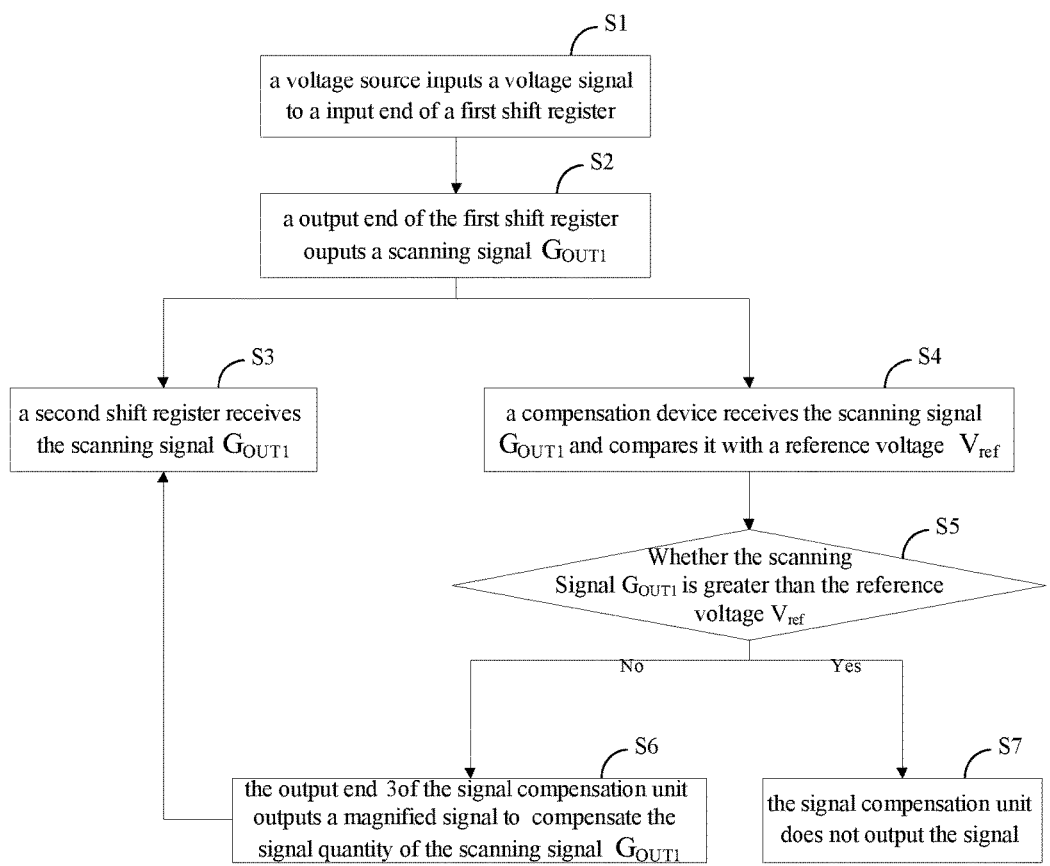
FIG. 6 is a flow chart schematic diagram of a gate driving circuit compensation method according to an exemplary arrangement of the present disclosure.

The exemplary arrangement also provides a gate driving circuit compensation method, which is applied to the gate driving circuit as described above, and FIG. 6 shows the specific flow of the compensation method.

At S1, a voltage signal is input to an input end of a first shift register;

At S2, an output end of the first shift register outputs a first scanning signal $G_{OUT1}$;

At S3, a second shift register receives the first scanning signal $G_{OUT1}$, at the same time, at S4, a compensation device receives the scanning signal $G_{OUT1}$ and compares it with a reference voltage $V_{ref}$.

The first scanning signal $G_{OUT1}$ which is output from the first shift register is fed back to the input end of the second shift register, at the same time, the compensation device which is electrically connected to the output end of the first shift register also receives the scanning signal $G_{OUT1}$ which is output from the first shift register. The compensation device may include a signal receiving unit and a signal compensation unit. The signal receiving unit is configured to receive the first scanning signal $G_{OUT1}$ and transmit it to a second input port 2 of the signal compensation unit. The signal compensation unit compares a reference voltage $V_{ref}$ which is input from a first input port 1 with the scanning signal $G_{OUT1}$, and a compensation signal is output to the second shift register according to the comparison result to compensate the first scanning signal $G_{OUT1}$.

At S5, whether the first scanning signal $G_{OUT1}$ is greater than the reference voltage $V_{ref}$ is judged.

Responsive to determining that the first scanning signal $G_{OUT1}$ is greater than the reference voltage $V_{ref}$ (S5:YES), the signal compensation unit does not output the signal at S7. Responsive to determining that the scanning signal $G_{OUT1}$ is not greater than the reference voltage $V_{ref}$ (S5:NO), the output end 3 of the signal compensation unit outputs a compensation signal to the second shift register to compensate the signal amplitude of the scanning signal $G_{OUT1}$ at S6.

The gate driving circuit compensation method in the present disclosure, on the one hand, can determine the degree of signal attenuation according to the comparison result of the scanning signal output from the front level shift register and the reference voltage, and can compensate the signal in time by the signal compensation unit, which improves the display effect of the display panel, ensures and improves the picture quality and customer experience; on the other hand, the compensation device has the advantages of simple structure, simple operation, reduced volume of the device, reduced manufacturing cost and improved manufacturing efficiency.

The technical personnel in the field should understand that the gate driving circuit in the present disclosure can set up a plurality of shift registers according to actual needs, as shown in FIG. 5. The compensation method is similar to the flow of FIG. 6. The output end of the front level shift register outputs a scanning signal, inputs it through the input end of the next level shift register. At the same time, the compensation device which is connected with two adjacent shift registers compares the scanning signal with the reference voltage, and outputs a compensation signal according to the comparison result.

Figure 7:
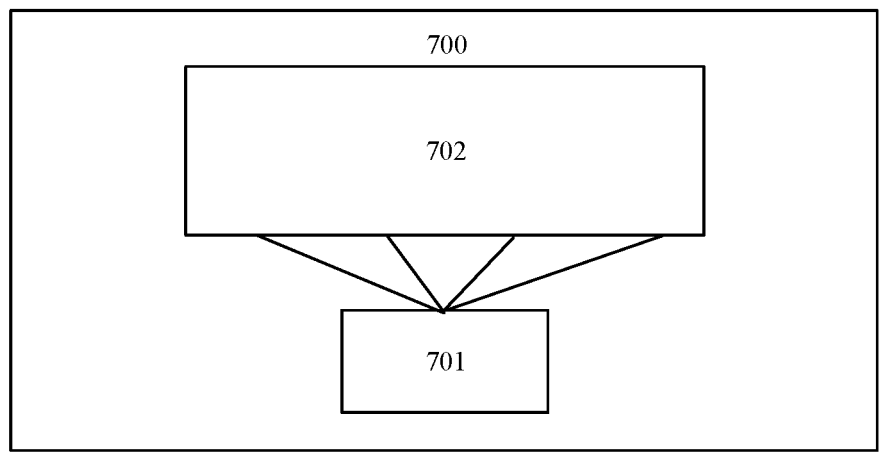
FIG. 7 is a schematic structural diagram of a display panel according to an exemplary arrangement of the present disclosure.

The exemplary arrangement also provides a display panel. As shown in FIG. 7, the display panel 700 includes a gate driving circuit 701 and a display unit 702 in the present disclosure. The gate driving circuit 701 may be located below or any side or around the display unit 702, and is electrically connected to the display unit 702 to drive the display of the display unit 702

Figure 8:
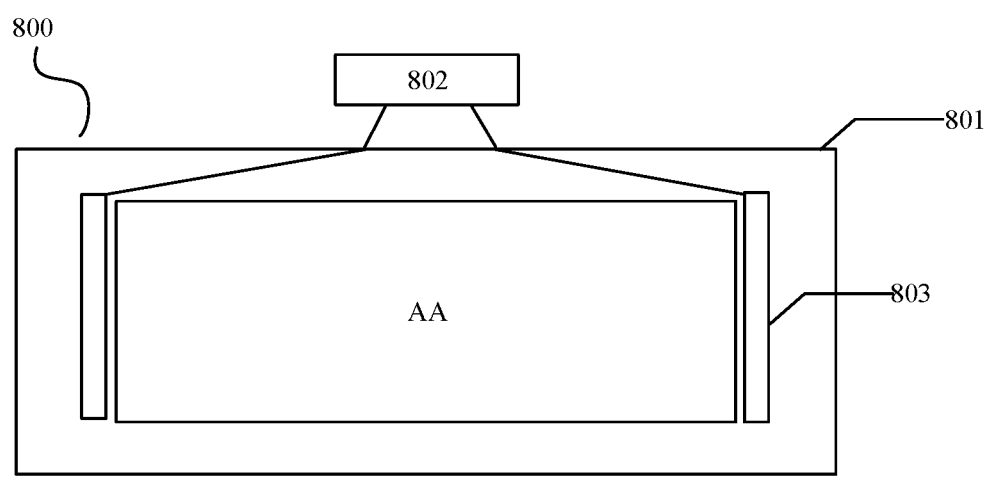
FIG. 8 is a schematic structural diagram of a display device according to an exemplary arrangement of the present disclosure.

The exemplary arrangement also provides a display device. As shown in FIG. 8, the display device 800 includes a display panel 801. A driving control panel 802 above the display panel 801 provides driving and control signals for the display panel 801. A gate driving circuit 803 is arranged on the left and right sides of the display panel 801, and can drive the horizontal scan line of the display area AA from the left and right sides. The gate driving circuit 803 receives the input signal from the driving control board 802 and generates a control signal for the horizontal scan line step by step, and can control the pixels in the display area AA to open by line. The display device 800 may be a liquid crystal display, and electronic paper, an OLED (Organic Light-Emitting Diode) display, a mobile phone, a tablet computer, a TV set, a notebook computer, a digital photo frame, a navigator, etc., which have a display function.

Those skilled in the art will easily think of other arrangements of the present disclosure after considering the specification and practicing the public inventions here. The present application is intended to cover any variations, uses or adaptations of the present disclosure, which follow the general principles of the present disclosure and include common knowledge or conventional technical means in the field that the present disclosure undisclosed. The specification and arrangements are only regarded as exemplary. The true scope and spirit of the present disclosure are indicated by the appended claims.

It should be understood that the present disclosure is not limited to the exact structure described above and shown in the accompanying drawings, and that various modifications and changes can be made without being separated from its scope. The scope of the present disclosure is restricted only by the appended claims.

What is claimed is:

1. A compensation device for a gate driving circuit, the gate driving circuit comprising a first shift register and a second shift register, the second shift register configured to output a second scanning signal according to a first scanning signal output from the first shift register; wherein, the compensation device for the gate driving circuit comprises:
    a signal receiving unit configured to receive the first scanning signal output from the first shift register;
    a signal compensation unit configured to compare the first scanning signal with a reference voltage and output a compensation signal to the second shift register according to a comparison result to compensate the first scanning signal received by the second shift register.

2. The compensation device for a gate driving circuit according to claim 1, wherein, the signal receiving unit is a capacitor or a voltage follower.

3. The compensation device for a gate driving circuit according to claim 1, wherein, the signal compensation unit is an amplifier.

4. A gate driving circuit, comprising:
    a plurality of cascaded shift registers, wherein an output end of the next level shift register is electrically connected to an input end of a current level shift register, the plurality of cascaded shift registers comprising a first shift register and a second shift register adjacent to each other; wherein the first shift register is configured to output a first scanning signal according to a first input signal; the second shift register is configured to output a second scanning signal according to a second input signal, and the first scanning signal is the second input signal of the second shift register;
    a compensation device, electrically connected with an output end of the first shift register and an input end of the second shift register; wherein the compensation device configured to receive the first scanning signal, compare the first scanning signal with a reference voltage; and output a compensation signal to the second shift register according to a comparison result to compensate the first scanning signal received by the second shift register.

5. The gate driving circuit according to claim 4, the compensation device comprising:
    a signal receiving unit, configured to receive first scanning signal outputs by the first shift register;
    a signal compensation unit, configured to compare the first scanning signal with the reference voltage, and output the compensation signal to the second shift register according to the comparison result to compensate the first scanning signal received by the second shift register.

6. The gate driving circuit according to claim 5, wherein, responsive to determining that the first scanning signal is less than the reference voltage, an output end of the signal compensation unit outputs a compensation signal.

7. The gate driving circuit according to claim 5, wherein, the signal receiving unit is a capacitor or a voltage follower.

8. A display device, comprising:
    the gate driving circuit according to claim 4.

9. A gate driving circuit compensation method, which is applied to a gate driving circuit, the gate driving circuit having a plurality of cascaded shift registers, an output end of a next level shift register being electrically connected to an input end of a current level shift register, the plurality of cascaded shift registers having a first shift register and a second shift register adjacent to each other, the first shift register being configured to output a first scanning signal according to a first input signal, the second shift register is configured to output a second scanning signal according to a second input signal, and the first scanning signal is the second input signal of the second shift register, a compensation device, electrically connected with an output end of the first shift register and an input end of the second shift register, the method comprising:
    receiving, by the compensation device, the first scanning signal of the first shift register;
    comparing the first scanning signal with a reference voltage, responsive to determining that the first scanning signal is less than the reference voltage, outputting, by the compensation device, a compensation signal to the second shift register to compensate for a signal amplitude of the first scanning signal.

10. The gate driving circuit compensation method according to claim 9, wherein, the compensation device comprising:
   a signal receiving unit, configured to receive first scanning signal outputs by the first shift register;
   a signal compensation unit, configured to compare the first scanning signal with the reference voltage, and output the compensation signal to the second shift register according to the comparison result to compensate the first scanning signal received by the second shift register.

11. The gate driving circuit compensation method according to claim 9, wherein, the compensation device comprising:
   a signal receiving unit, configured to receive the first scanning signal outputs by the first shift register;
   a signal compensation unit, configured to compare the first scanning signal with the reference voltage, and output the compensation signal to the second shift register according to the comparison result to compensate the first scanning signal received by the second shift register.

12. The gate driving circuit compensation method according to claim 11, wherein, the signal receiving unit is a capacitor or a voltage follower.

13. The gate driving circuit compensation method according to claim 9, wherein, responsive to determining that the first scanning signal is less than the reference voltage, an output end of the signal compensation unit outputs the compensation signal.

* * * * *